United States Patent [19]

Han et al.

[11] Patent Number: 5,547,788
[45] Date of Patent: Aug. 20, 1996

[54] MASK AND METHOD FOR MANUFACTURING THE SAME

[75] Inventors: Woo-sung Han, Suwon; Chang-jin Sohn, Kwangmyeong, both of Rep. of Korea

[73] Assignee: Samsung Electronic Co., Ltd., Suwon, Rep. of Korea

[21] Appl. No.: 205,499

[22] Filed: Mar. 4, 1994

[30] Foreign Application Priority Data

Mar. 4, 1993 [KR] Rep. of Korea ............... 93 3216
Apr. 20, 1993 [KR] Rep. of Korea ............... 93 6626

[51] Int. Cl.$^6$ ..................................... G03F 9/00
[52] U.S. Cl. .................. 430/5; 430/322; 430/396; 430/323; 430/324
[58] Field of Search .................. 430/5, 322, 396, 430/323, 324

[56] References Cited

U.S. PATENT DOCUMENTS

5,130,263  7/1992  Possin et al. ............... 430/311
5,389,474  2/1995  Iguchi et al. ............... 430/5

*Primary Examiner*—S. Rosasco
*Attorney, Agent, or Firm*—Cushman, Darby & Cushman, L.L.P.

[57] ABSTRACT

A mask and a method for manufacturing the same, which can form a correct pattern on a semiconductor wafer having steps, includes a mask substrate having steps oppositely corresponding to steps on said semiconductor wafer and an opaque mask pattern for cutting off light from the mask substrate to thereby enable the same exposure focus to be provided to the step and non-step regions on the semiconductor wafer. Further, a clean and correct pattern can be formed by controlling the amount of exposure irradiated onto the step and non-step regions on the semiconductor wafer.

23 Claims, 10 Drawing Sheets

MASK AND METHOD FOR MANUFACTURING THE SAME

BACKGROUND OF THE INVENTION

The present invention relates to a semiconductor photolithography technique, and more particularly, to a photolithography mask and method for manufacturing the mask which can be used to form a fine pattern on a semiconductor substrate.

Generally, it is well known that various semiconductor patterns can be formed by photolithography. Photolithography can largely be divided into two steps.

First, a photoresist whose solubility is changed by exposure to, for example, ultraviolet, X-ray or electron beam radiation, is coated on an insulating film or a conductive film formed on a semiconductor substrate, i.e., on a film wherein a pattern is to be formed. A predetermined portion of the photoresist is exposed to light using a mask, and the portion having a high solubility is removed by a development process, to thereby form a photoresist pattern.

Second, an exposed portion of film is removed by an etching process, to thereby form various kinds of patterns such as wiring or electrodes.

Recently, photolithography has become an important process in the production of semiconductor devices having a high packing density. Typically, a semiconductor device repeatedly goes through the process of serially forming and patterning a plurality of films on a semiconductor substrate. As the manufacturing procedure has developed, high packing density of the semiconductor device can be achieved when the fine pattern is formed on a stepped structure.

Figure 1A:
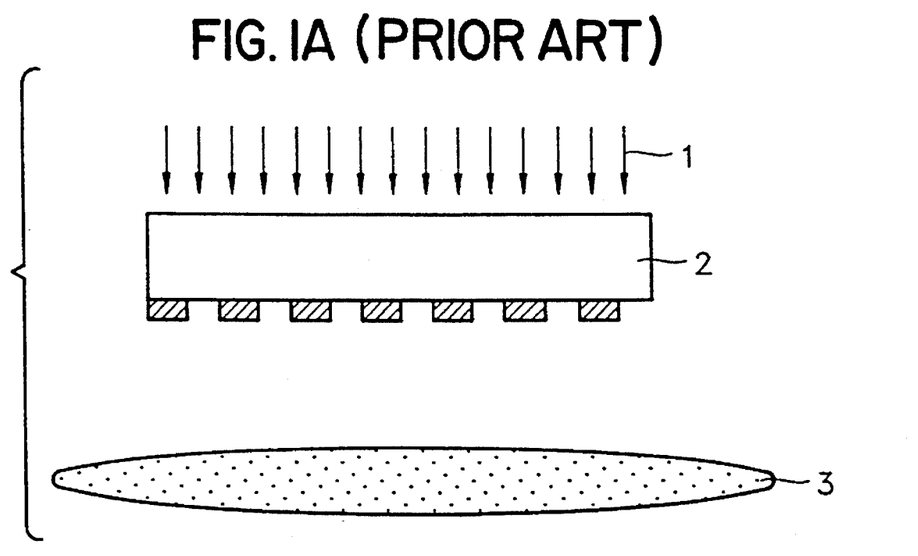
FIG. 1 shows a method for forming a pattern by the conventional method.
Figure 1B:
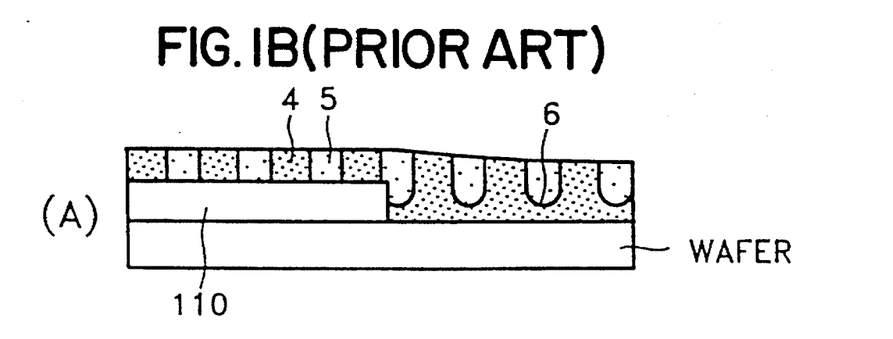
Figure 1C:
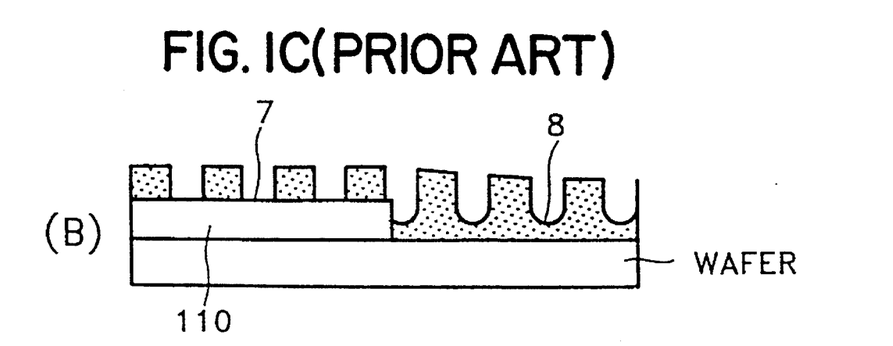
Figure 2A:
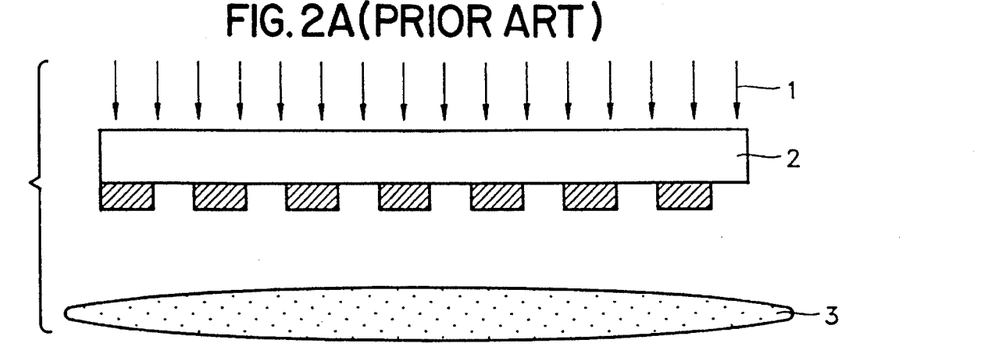
FIG. 2 shows a conventional method for forming a fine pattern using a multi-layer resist (MLR) method.
Figure 2B:
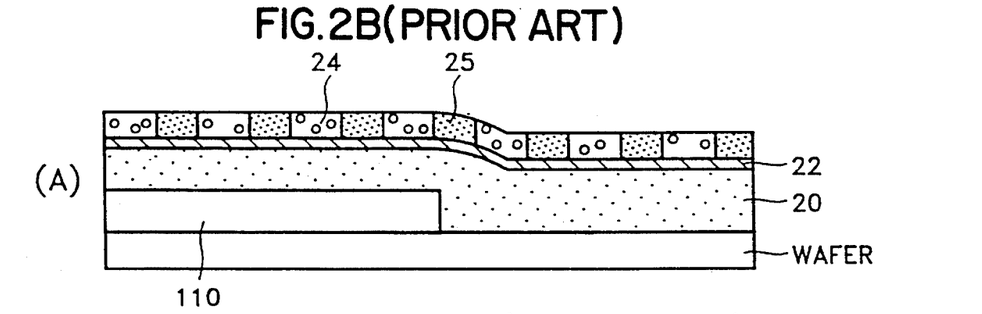
Figure 2C:
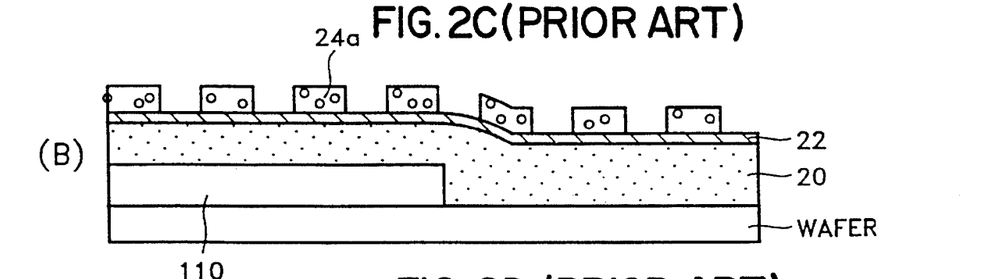
Figure 2D:
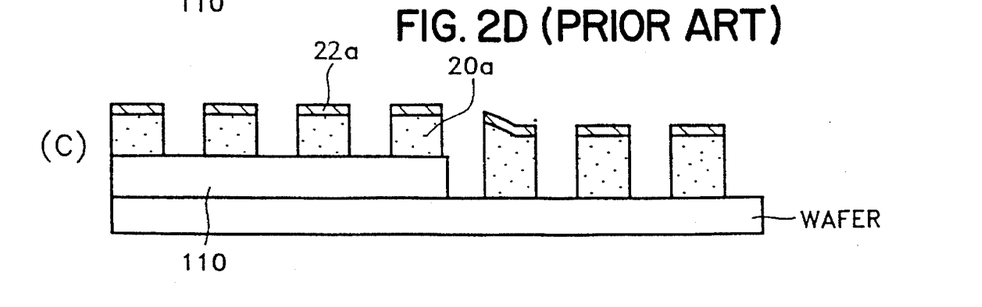

FIG. 1 shows a method for forming a pattern by the conventional method.

When an ultraviolet or an electron beam 1 is irradiated onto a mask 2 having a mask pattern, the mask pattern is projected via a projection lens 3 of a stepper onto a photoresist formed on a semiconductor wafer 9 having a stepped portion 110. At this time, the part of the photoresist formed on the top of stepped portion 110 is sufficiently exposed (reference numeral 4 denotes an unexposed photoresist portion and 5 denotes an exposed photoresist portion), whereas the photoresist portion 6 formed over the wafer 9 is under-exposed. The resulting photoresist pattern is shown in (B) of FIG. 1. The part of the photoresist formed over the stepped portion 110 is much thinner than that formed over the wafer regions which are below the stepped portion 110, when a photoresist is coated onto the semiconductor wafer 9 having stepped portion 110. Thus, when the photoresist is exposed, the photoresist formed on the wafer regions at the bottom of stepped portion 110 is insufficiently exposed. Therefore, the resulting photoresist at the bottom of stepped portion 110 has a "bridge" between patterns where exposure is insufficient at reference numeral 6, thereby making it difficult to form an exact pattern.

To overcome this problem, a multi-layer resist (MLR) method has been proposed.

FIG. 2 shows a method for forming a fine pattern using the MLR method.

Specifically, a lower photoresist layer 20 is coated on a semiconductor wafer 26 having a stepped structure 110, and an upper photoresist is coated on an insulating material layer 22, (e.g., an oxide film) disposed between the upper and lower photoresist layers. Then, a light 1 is irradiated onto the semiconductor wafer using mask 2 and projection lens 3, so that the upper photoresist layer can be exposed as shown in (A) of FIG. 2 (reference numeral 24 is an unexposed portion of the upper photoresist, reference numeral 25 is an exposed portion of the upper photoresist). Then, the upper photoresist is developed to form an upper photoresist pattern 24a as shown in (B). Then, as shown in (C) of FIG. 2, the insulating material layer 22 is anisotropically etched using the upper photoresist pattern 24a as an etching mask, to thereby form an insulating pattern 22a. Lower photoresist 20 is anisotropically etched, to thereby form a lower photoresist pattern 20a.

When a fine pattern is formed on a semiconductor wafer having a stepped structure using, the MLR method, only the upper photoresist is formed, exposed and developed, and the insulating material layer 22 and the lower photoresist 20 are anisotropically etched using the developed upper photoresist as an etching mask, to thereby form a pattern. Therefore, a photoresist residue cannot be generated on the semiconductor wafer at the bottom of stepped structure 110.

However, the MLR method is too complicated and productivity is poor, which increases cost. In addition, anisotropic etching can result in defects.

SUMMARY OF THE INVENTION

It is an object of the present invention to provide a photolithography mask which can correctly form a fine pattern on a semiconductor wafer having a stepped region or portion.

It is another object of the present invention to provide a simple method for manufacturing the photolithography mask.

To accomplish these and other objects, a photolithography mask is provided for projecting a pattern onto a semiconductor wafer having a stepped structure comprising:

a mask substrate having steps conforming with the stepped structure on the semiconductor wafer; and an opaque mask pattern for blocking off light from said mask substrate where said steps are formed.

It is desirable for the steps of the mask substrate to have a thickness substantially equal to the steps on the semiconductor wafer, multiplied by the square of the magnification of a projection lens used with the mask.

Further, it is desirable to form steps of the mask substrate so as to have a phase difference of 360°±5° when light passes through the stepped and non-stepped regions of the mask substrate.

In addition, the sides of the steps of the mask substrate may be one of three types, i.e., perpendicular, staircase having a plurality of steps, and a slope having a predetermined incline.

Another photolithography mask for transferring a pattern onto a semiconductor wafer having a stepped structure is provided, comprising:

a mask substrate;

an optically transparent film pattern formed on a portion of the mask substrate in conference with the stepped structure on the semiconductor wafer; and an opaque mask pattern for cutting off light from the substrate and the optical, transparent film pattern.

Further, a mask is provided for transferring a pattern onto a semiconductor wafer having a stepped portion comprising:

a transparent mask substrate;

an opaque mask pattern formed on the mask substrate; and an optical transmittivity control film pattern formed on a portion of the opaque mask pattern and the mask substrate, and which has a structure corresponding to steps formed on the semiconductor wafer.

It is desirable to use materials such as a photoresist, a thin chrome, a thin aluminum, spin-on glass (SOG) or $SiO_2$, whose optical transmittivity is different from that of the material constituting the mask substrate, for the optical transmittivity control film pattern.

In addition, the thickness of optical transmittivity control film pattern should selected to avoid having a phase difference of 180°±20° between light passing through an optical transmittivity control film pattern region and non pattern region on a mask substrate.

To accomplish another object of the present invention, a mask manufacturing method is provided comprising the steps of:

forming steps in a mask substrate in conformance with a stepped structure on a semiconductor wafer;

forming an opaque material layer for cutting off light from the mask substrate where the stepped structure is formed; and forming an opaque mask pattern by patterning the opaque material layer.

The steps of the mask substrate can be formed by directly etching the main surface of the mask substrate, or by depositing a transparent material, (for example, spin-on glass (SOG)), on the mask substrate and patterning the resultant material.

In addition, a mask manufacturing method is provided comprising the steps of:

forming an opaque material layer for cutting off light from a transparent mask substrate;

forming an opaque mask pattern by patterning the opaque material layer;

forming an optical transmittivity control film on the mask substrate where the opaque mask pattern is formed; and forming an optical transmittivity control film pattern having a structure that corresponds to the steps on the semiconductor wafer to be patterned, in a portion of said opaque mask pattern and said mask substrate.

According to the present invention, the same exposing focus can be formed on the steps and on the semiconductor wafer. A clean and correct pattern can be formed by controlling the amount of exposure radiated to the steps.

BRIEF DESCRIPTION OF THE DRAWINGS

The above objects and other advantages of the present invention will become more apparent by describing in detail a preferred embodiment thereof with reference to the attached drawings in which.

DETAILED DESCRIPTION OF THE INVENTION

The present invention will be explained in more detail with reference to the attached drawings.

Figure 3:
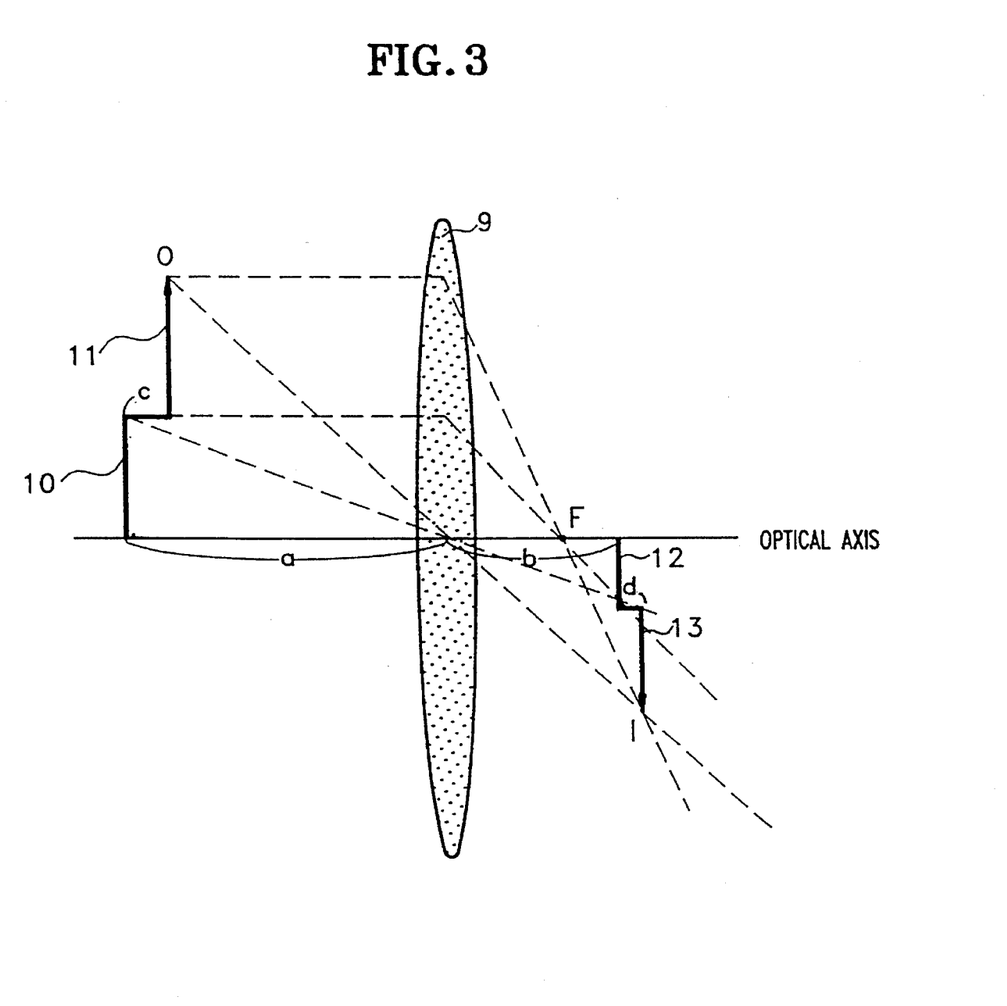
FIG. 3 illustrates a projection principle of a basic optical system.

FIG. 3 shows the projection principle of the basic optical system. First, the principle for forming an image is as follows.

As shown in FIG. 3, a focus of an optical system is indicated as F. The incidental light parallel to an optical axis from the subject O is refracted and passes focus F. The light that passes the center of the optical system passes without refraction. A correct image I is therefore formed at the point where the passed light and the focus-passed light meet.

As shown in FIG. 3, if there are arrow subjects 10 and 11 adjacent to an optical system 9 by the distance of c, corresponding opposite phases 12 and 13 are formed on the projection surface according to the above principles. Arrow subject 10 focuses onto region 12, while arrow subject 11 focuses onto region 13 which is offset from region 12 by the distance d. Image size I is determined in accordance with the magnification m of the optical system. The magnification can be expressed as follows.

$$\text{magnification } (m) = \frac{b}{a} = \frac{I}{O} = \left(\frac{d}{c}\right) (m > 0)$$

The magnification of the optical systems used for common semiconductor lithography techniques can be 1:1, 1:4, 1:5 or 1:10. Here, in image I, if d is assumed to be the size of a stepped portion on a semiconductor wafer, the subject has a stepped portion with a corresponding size of c. Thus, when steps on a mask are formed proportional to the thickness of steps on the semiconductor wafer and a stepped structure on a mask is formed opposite to the stepped structure on the semiconductor wafer, then the same exposing focus can be irradiated onto the semiconductor wafer.

Figure 4A:
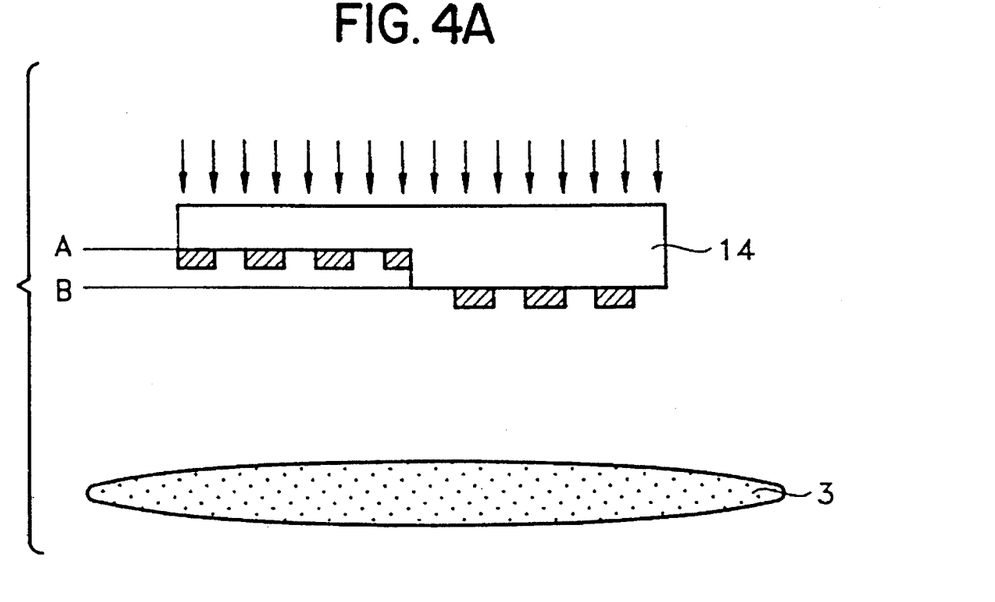
FIG. 4 show a method for forming a fine pattern using a first mask of the present invention.
Figure 4B:
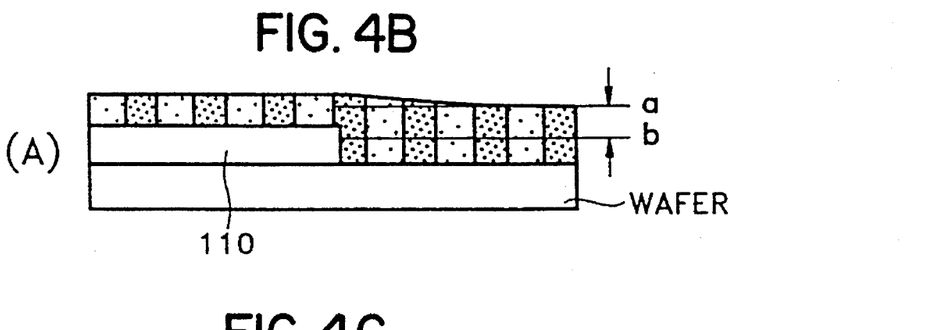
Figure 4C:
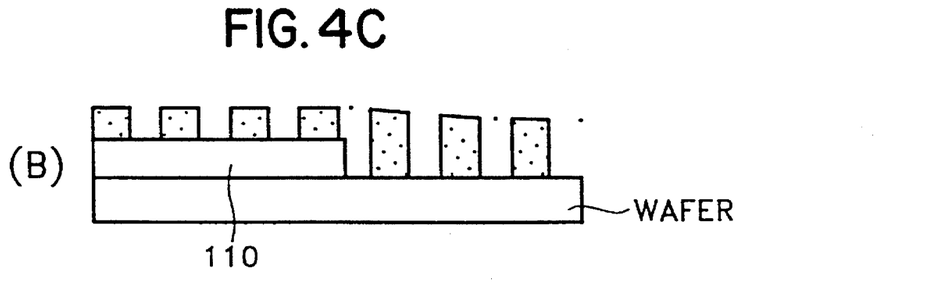

FIG. 4 shows a method for forming a fine pattern using a first mask of the present invention manufactured according to the principles described in FIG. 3.

When an ultraviolet or electron beam, for example, is irradiated on a mask 14 having a mask pattern, the mask pattern is projected onto a photoresist formed on a semiconductor wafer which has steps 110 via projection lens 3 of a stepper.

Specifically, as shown in "A" of FIG. 4, when a photoresist is coated on a semiconductor wafer 30 having a stepped portion 110, the photoresist coating is thicker at the bottom of stepped portion 110 than at the top of stepped portion 110.

As shown in "A" of FIG. 4, when it is assumed that "a" is a line at half of the thickness of the photoresist at the top of stepped portion 110 and "b" is a line at half of the thickness of the photoresist at the bottom of steps, steps corresponding to "a b", i.e., the difference of the thickness between the upper end and the lower end of steps, exist on the semiconductor wafer 30.

The best exposure is achieved when transparent lens 3 focuses at a point located at half of the thickness of the photoresist. Therefore, a mask should be produced so that "a b", a thickness difference of the respective photoresists of the upper end and the lower end of the step, corresponds to the degree of "A B" on the mask. In this manner, the same exposing focus is formed on the upper and lower ends of the stepped portion of the semiconductor wafer 30, as described above, to thereby form a correct pattern.

The size of step "A B" on the mask is equal to the size of "a b" on the semiconductor wafer, in the case of a 1:1 transparent lens, and is "25×(a b)", for the case of a 1:5 transparent lens 3. That is, it is desirable for the thickness of "A B", i.e., the step on the mask, to equal "step (a b)×(magnification of the transparent lens 2)".

As will be appreciated by those of skill in the art, the step border region (reference designation p in FIG. 12) on the mask acts as a chromeless phase shifting mask. Thus, a thin line may be produced on the semiconductor wafer due to the phase difference of the light in the step and non-step regions on the mask. Therefore, the step on the mask has to be controlled so that the phase difference is not 180°. The thickness of the step necessary to result in a phase difference of 360°, not 180°, can be expressed as follows:

$$\theta \text{ (phase difference)} = \frac{2\pi t(n-1)}{\lambda}$$

This expression can be stated in another way.

$$t = \frac{\lambda \theta}{2\pi(n-1)}$$

Wherein, if $2\pi$ is substituted for a phase difference, the result will be expressed as follows.

$$t = \frac{\lambda}{(n-1)}$$

Wherein, $\lambda$ is the wavelength of the light source in use, n is the refractive index of the mask, and t is step thickness. That is, if $t=\lambda/(n-1)$, the wavelength of the light source in use is 365 nm, and quartz (whose refractive index n is 1.5) is used as a mask substrate, then, $$t = \frac{365 \text{ nm}}{(1.5-1)} = 730 \text{ nm}$$

That is, mask steps having a thickness of 730 nm must be formed when the mask is needed to have a phase difference of 360° rather than 180°.

When a stepper using a transparent lens having a magnification of 1:5 is used, the step thickness on a semiconductor wafer can be expressed as follows.

$$a - b = \frac{A-B}{25} = \frac{730 \text{ nm}}{25} = 29.2 \text{ nm} = 292 \text{Å}$$

That is, if 292 Å-thick steps exist on the semiconductor wafer 30, a phase difference of 360° exists when steps of 730 nm(7,300 Å) are formed on the mask. In this manner, the chromeless phase shifting mask effect can be eliminated and exposure focus on the non-stepped regions of the wafer 30 can be improved. As will be appreciated by one skilled in the art, a phase difference of 360° is most desirable in order to avoid the chromeless phase shifting mask effect. However, the chromeless phase shifting mask effect can be at least reduced, though not perfectly eliminated, if the phase difference is not $2\pi n \pm 20°$ (where n is an integer).

Accordingly, when a photoresist is exposed using a mask of the present invention, an exposure focus is formed at the line of a in the photoresist at the top of stepped region 110, and an exposure focus is formed at the line of b in the photoresist at the non-step region. Thus, patterning is performed cleanly, without leaving a photoresist residue on the wafer region after developing. By way of example, light such as g-ray (wavelength 436 nm), i-ray (wavelength 365 nm), h-ray (wavelength 405 nm), broad band (wavelength 300 to 500 nm, especially 240 to 300 nm), KrF excimer laser (wavelength 248 nm) and ArF excimer laser (wavelength 193 nm) can be used as a light source for the exposure process. The photoresist should be selected to correspond with the wavelength of the selected light source.

In addition, the step size on the semiconductor wafer 30 can be determined within the range which the field depth of a projection lens permits. Therefore, a thickness "A–B" of a step on the mask has to be formed within the range that satisfies the following expression.

$$A - B = m^2(a-b) = \frac{\lambda}{(n-1)}$$

FIG. 5 to FIG. 12 are sectional views illustrating a first embodiment of a method for manufacturing a first mask of the present invention.

Figure 5:
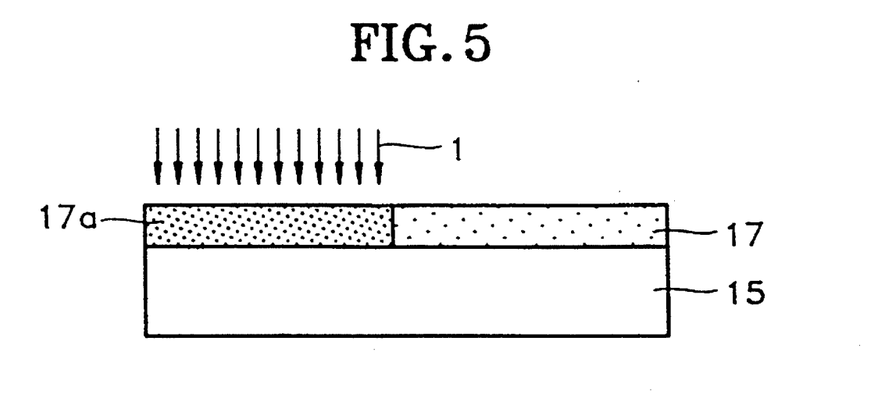
FIG. 5 to FIG. 12 are sectional views illustrating a first embodiment of a method for manufacturing a first mask according to the present invention.

FIG. 5 shows a step of coating photoresists 17 and 17a on a mask substrate 15 and exposing the resultant structure with optical radiation.

Photoresists 17 and 17a, having a thickness of between 0.3μm to 2.0μm, are coated onto mask substrate 15 which consists of material transparent with respect to optical radiation 1, such as quartz. Then, the resultant structure is exposed, to thereby expose photoresist 17a, predetermined portion of which is to etch mask substrate 15.

Figure 6:
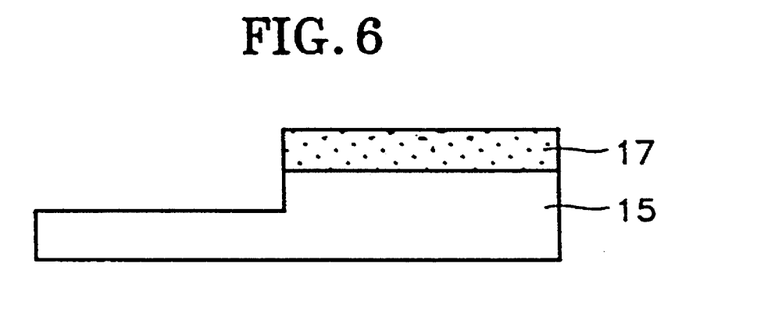

FIG. 6 shows a step of etching the main surface of the substrate 15 after photoresist pattern 17 is formed.

More particularly, photoresist pattern 17 is formed by developing the exposed photoresist. Then, the main surface of mask substrate 15 is anisotropically etched using pattern 17 as an etching mask.

Figure 7:
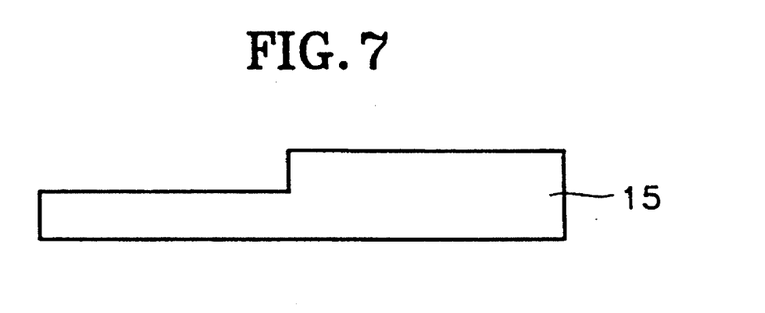

FIG. 7 shows a step of stripping photoresist pattern 17 and of removing the result.

Specifically, mask substrate 15 having a predetermined step portion is formed by removing photoresist pattern 17.

Figure 8:
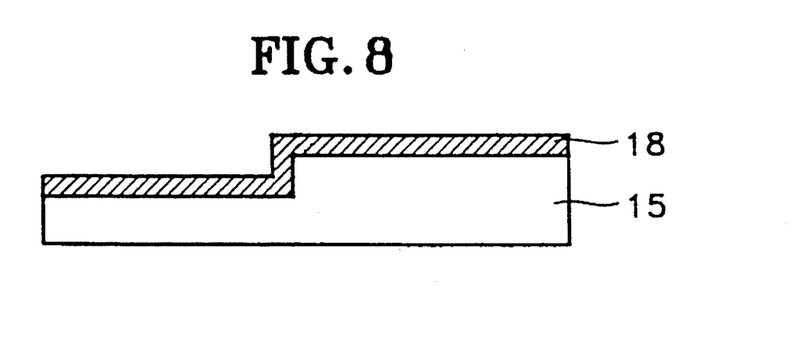

FIG. 8 shows a step of forming an opaque material layer 18 on the mask substrate 15 having the step portion.

More particularly, opaque material layer 18 is formed by depositing an opaque material for cutting off light, such as chrome, onto mask substrate 15 where the step portion is formed. At this time, a chrome oxide film can additionally be deposited on the chrome so as to form opaque material layer 18.

Figure 9:
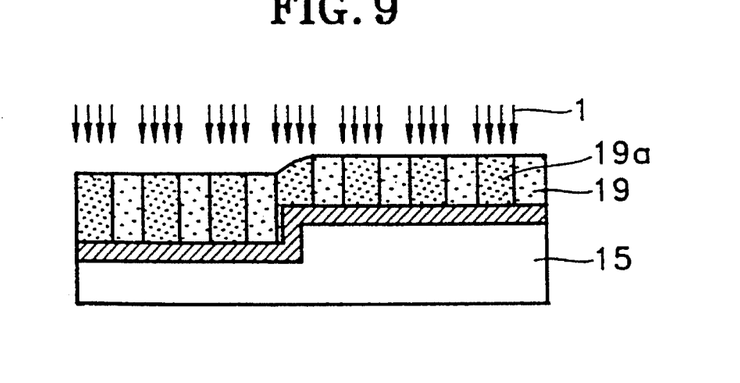

FIG. 9 shows a step of coating a photoresist on opaque material layer 18 and exposing the resultant material.

Specifically, a photoresist is coated on opaque material layer 18, and is exposed by irradiating light 1. Thus, the photoresist can be divided into the exposed photoresist 19a and the unexposed photoresist 19.

Figure 10:
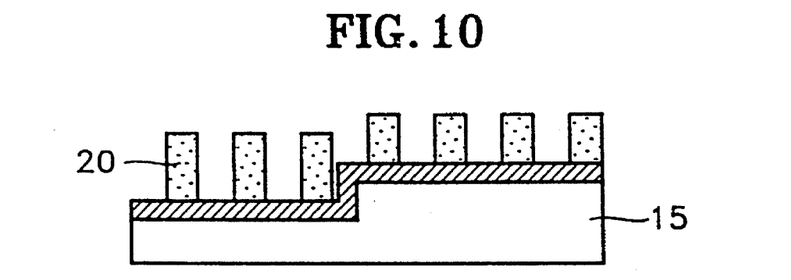

FIG. 10 shows a step of patterning the photoresists.

Specifically, a photoresist pattern 20 is formed by developing photoresists 19 and 19a. Exposed photoresist portions 19a are removed.

Figure 11:
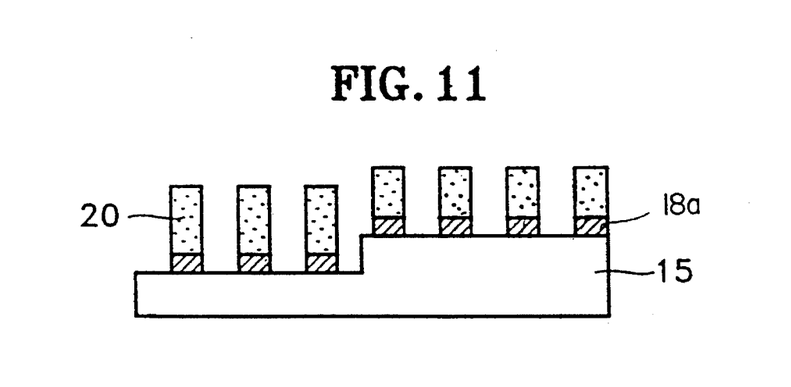

FIG. 11 shows a step of forming a opaque mask pattern 18a by patterning opaque material layer 18.

In more detail, opaque material layer 18 is anisotropically etched using photoresist pattern 20 as an etching mask. Thus, an opaque mask pattern 18a is formed on the substrate 15.

Figure 12:
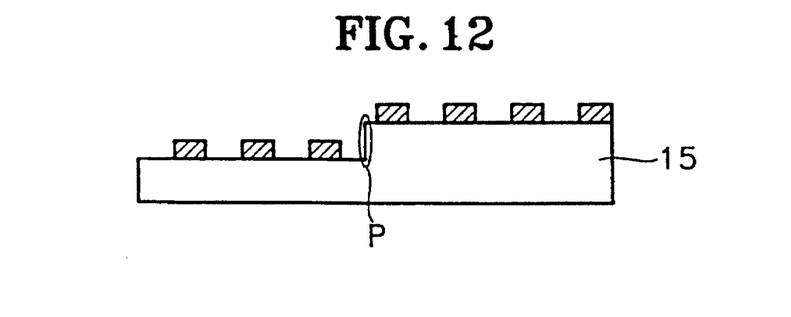

FIG. 12 shows a step of stripping photoresist pattern 20 and removing the result.

In more detail, opaque mask pattern 18a consisting of opaque material is formed by removing photoresist pattern 20, to thereby complete a mask of the present invention. Reference designation P denotes a step border region between the step region and the non-step region described above.

FIG. 13 to FIG. 16 are sectional views illustrating a second embodiment of a method for manufacturing a first mask of the present invention.

Figure 13:
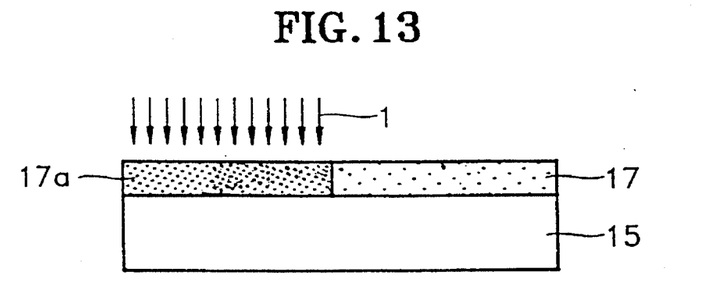
FIG. 13 to 16 are sectional views illustrating a second embodiment of a method for manufacturing a first mask according to the present invention.

FIG. 13 shows a step of depositing photoresists 17 and 17a on mask substrate 15 and exposing the resultant structure.

First, as explained in reference to FIG. 5, photoresists 17 and 17a are coated onto mask substrate 15. Then, a predetermined portion of the photoresist is exposed by irradiating light 1. At this time, photoresists 17 and 17a can be deposited at a thickness of approximately 2μm to 3μm. Alternatively, photoresists 17 and 17a having a large incline for a sloped etching due to the characteristics of the material can be used.

Figure 14:
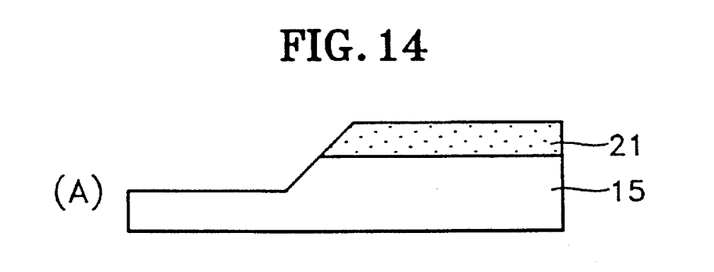

FIG. 14 shows a step of performing a slope etching on mask substrate 15 using a photoresist pattern 21.

Specifically, a photoresist pattern 21 having a slope is formed by etching the exposed photoresist 17a. At this time, as a method for forming the sloped photoresist shown in FIG. 13, a photoresist having a large slope due to the characteristics of the constituent material can be used to perform a sloped etching. Otherwise, the photoresist is perpendicularly patterned and the baking temperature is increased to above the transition temperature of the material constituting mask substrate 15, to thereby make the photoresist fluid and sloping.

Then, the main surface of mask substrate 15 is slope-etched by performing an anisotropical etching where photoresist pattern 21 having the above-described slope is used as an etching mask. In another method, a perpendicular step is formed in the mask substrate as shown in the first embodiment, and a transparent insulating film is deposited. Then, the transparent insulating film is etched so as to form a transparent insulating film spacer in the side wall of the perpendicular step of the mask substrate. Then, the slope-etching can be performed using a slope of the transparent insulating film spacer.

Figure 15:
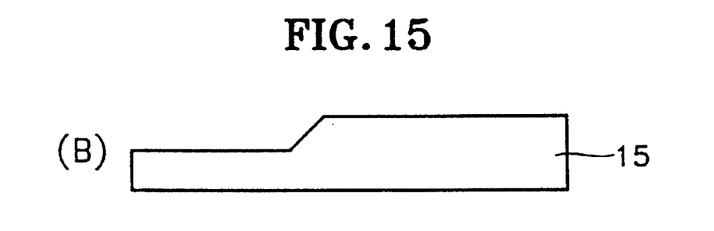

FIG. 15 shows the step of stripping photoresist pattern 21 and removing the result.

Specifically, photoresist pattern 21 used as an etching mask is removed, to thereby form mask substrate 15 having a predetermined step.

Figure 16:
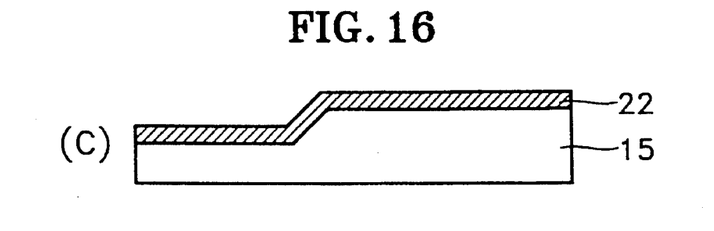

FIG. 16 shows the step of forming a opaque material layer 22 on mask substrate 15 having the above-described step.

In more detail, material which can block light, for example, chrome, is deposited on mask substrate 15 where a step is formed, to thereby form opaque material layer 22.

According to the above-described second embodiment, an anisotropical etching process is not necessary to ensure a 360° phase difference of the step of a mask substrate as in the first embodiment. Rather, a sloped etching is performed on the surface of the mask substrate to avoid depending on the thickness of a step of the mask.

Figure 17:
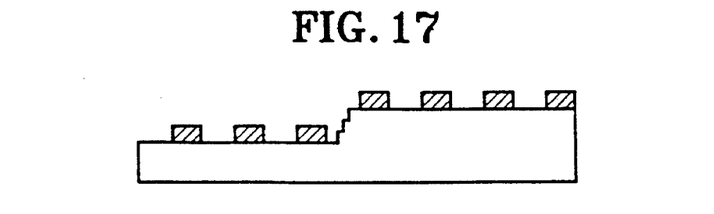
FIG. 17 is a sectional views illustrating a third embodiment of a method for manufacturing a first mask according to the present invention.

FIG. 17 is a sectional view illustrating a third embodiment of a method for manufacturing a first mask of the present invention.

Specifically, the border region of the step portion in the mask substrate is formed into a multi-staircase shape to thereby avoid depending on the thickness of a step of the mask, as in the first embodiment.

In addition, as shown in embodiments 1, 2 and 3, the step of a mask is formed as follows.

Material transparent to light, such as spin-on glass (SOG), is coated on a mask substrate without etching the mask substrate. Then, the optically transparent film is etched by a photo-etching process, to thereby form a step consisting of an optical transparent film pattern on the mask substrate.

Figure 18A:
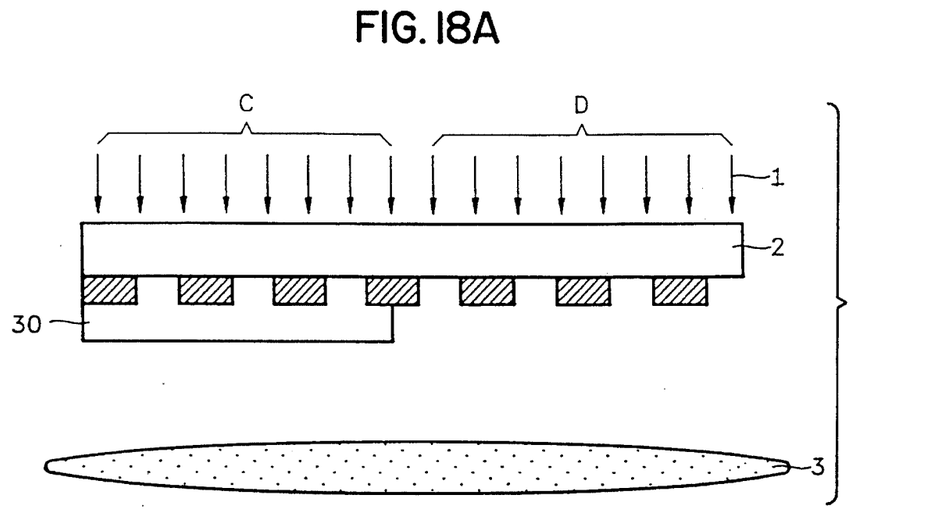
FIG. 18 is a sectional view illustrating a method for forming a fine pattern using a second mask of the present invention.
Figure 18B:
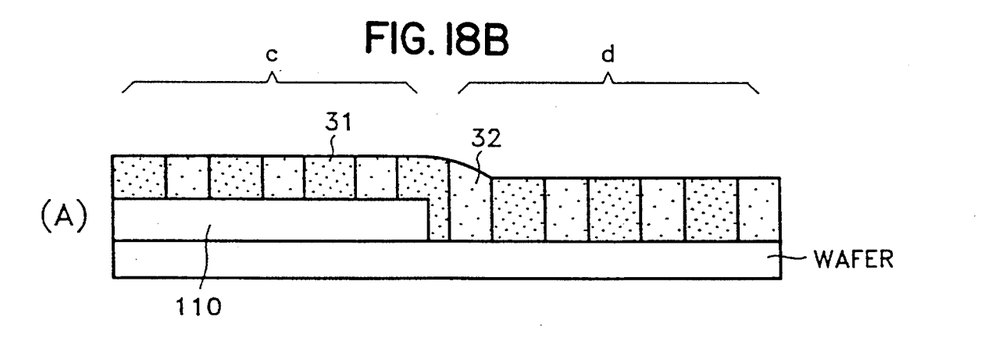
Figure 18C:
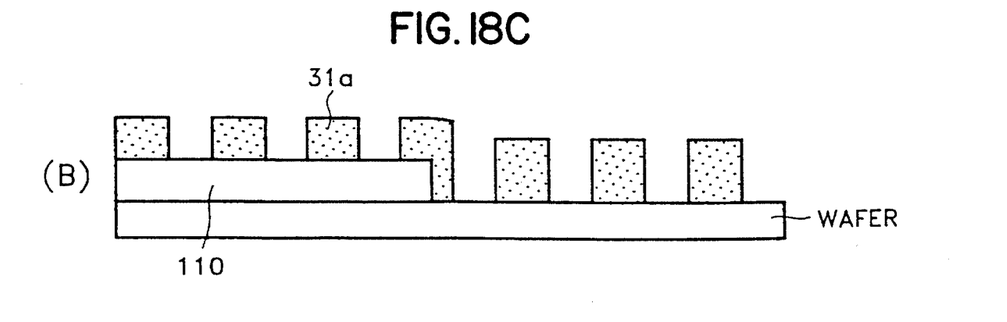

FIG. 18 illustrates a method for forming a fine pattern using a second mask of the present invention.

When light, such as ultraviolet or electron beam radiation, is irradiated onto mask 2 having a mask pattern, the mask pattern is projected onto a photoresist layer formed on a semiconductor wafer 42, which has stepped portion 110, through projection lens 3 of a stepper.

An optical transmittivity control film pattern 30, having a structure corresponding to a step on the semiconductor wafer 42 to be patterned, is formed from a material whose optical transmittivity is different from that of the material of mask substrate 2 with respect to light 1. The amount of light passing through pattern region C on mask substrate 2 should be less than the amount of light which passes through pattern region D, which does not include control transmittivity control film pattern 30. Thus, a correct pattern can be formed on semiconductor wafer 42 having a step portion 110. The optical transmittivity control film pattern 30 should have a thickness which avoids a phase difference of between 180°±20° when the light passes through a region including the transmittivity control film pattern and a region which does not include the transmittivity control film pattern on a mask substrate.

Specifically, after a photoresist layer is deposited on a semiconductor wafer 42 having step portion 110, the photoresist layer is exposed using a mask 2 upon part of which optical transmittivity control film pattern 30 is formed. The photoresist is then divided into an exposed photoresist portion 32 and an unexposed photoresist portion 31, such that a photoresist portion d on the semiconductor wafer 42 (See FIG. 18(a)) is exposed via non-pattern region D of the mask 2. Similarly, photoresist portion c on step portion 110 of semiconductor wafer 42 is exposed through pattern region C of the mask 2. Thus, the amount of light irradiated onto the semiconductor wafer 42 itself is more than that irradiated onto the step portion 110 of semiconductor wafer 42. As a result, the problem of incomplete pattern formation due to an insufficient amount of light exposure can be solved, and a correct photoresist pattern 31a can be formed.

Figure 19:
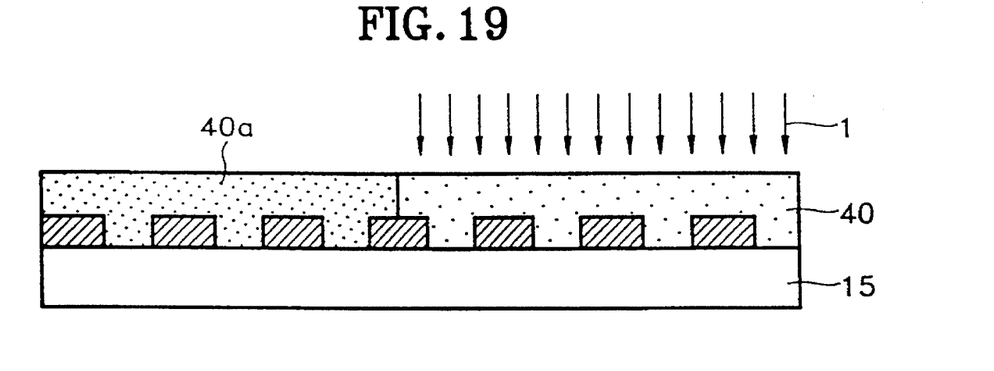
FIG. 19 to FIG. 20 are sectional views illustrating a method for forming a second mask of the present invention.
Figure 20:
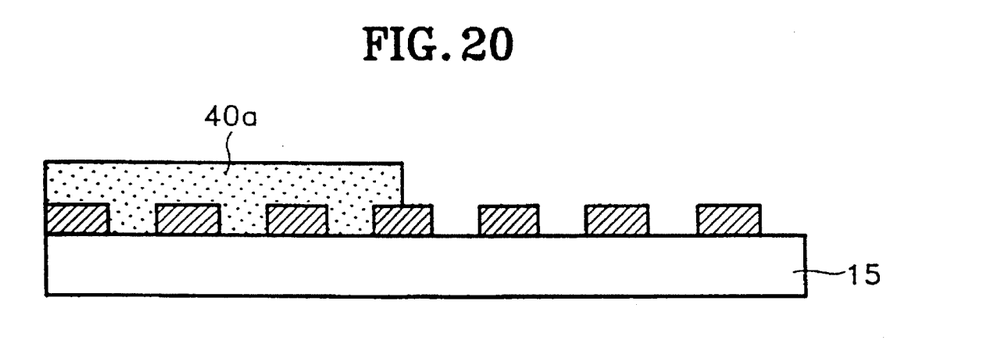

FIG. 19 and FIG. 20 are sectional diagrams for illustrating a method for manufacturing a second mask of the present invention.

FIG. 19 shows a step of forming optical transmittivity control films 40 and 40a on mask substrate 15a on which an opaque mask pattern 15 is formed, and exposing the formed optical transmittivity control films with a light 1.

Specifically, an opaque material for cutting off light, such as chrome, is formed on mask substrate 15, which consists of a material transparent to light, such as quartz. The opaque material is patterned to thereby form an opaque mask pattern 15. Then, optical transmittivity control films 40 and 40a, whose optical transmittivity are different from that of the material of mask substrate 15, such as a photoresist, are deposited all over mask substrate 15 where the opaque mask pattern 15 is formed. Then, a predetermined portion 40 of the photoresist is exposed to light 1.

FIG. 20 shows a step of forming transmittivity control film pattern 40a.

Specifically, optical transmittivity control film pattern 40a consisting of a photoresist material is formed on the mask substrate 15a by means of etching the exposed photoresist material 40. Alternately the photoresist material can be replaced by a thin layer of chrome, aluminum, spin-on glass (SOG) or $SiO_2$. When spin-on glass (SOG) is used, spin-on glass (SOG) is deposited on the mask substrate by a spin-coating method, and a photoresist is deposited on the spin-on glass (SOG). Then, after the photoresist is exposed and developed, the spin-on glass (SOG) is anisotropically etched using the patterned photoresist as an etching mask to thereby form a pattern of spin-on glass (SOG) on the mask substrate.

Figure 21:
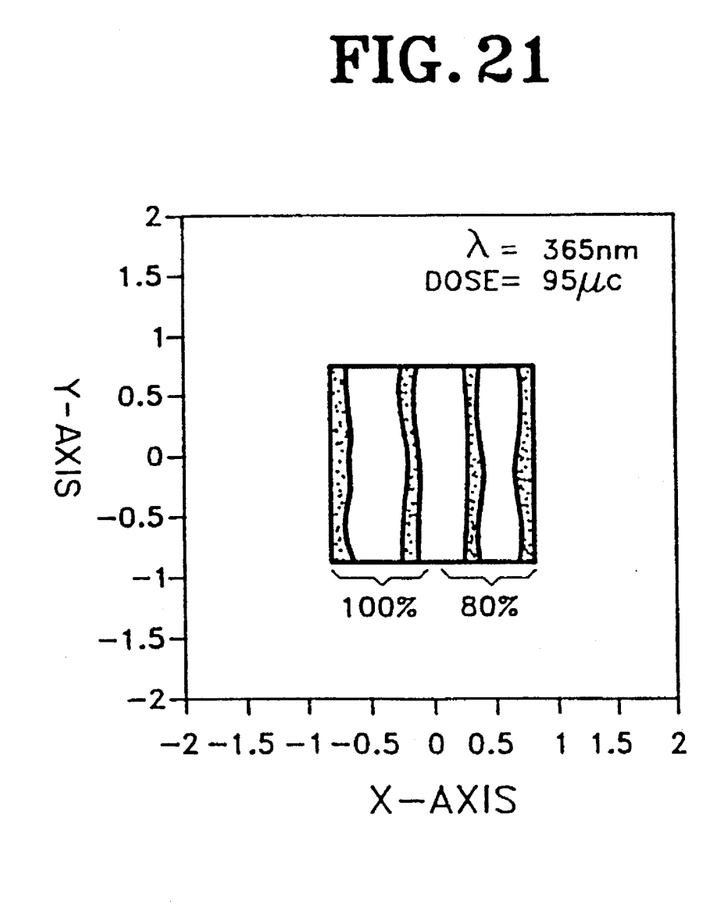
FIG. 21 to FIG. 22 are sectional views illustrating a simulation result of forming a photoresist pattern using a second mask of the present invention.
Figure 22:
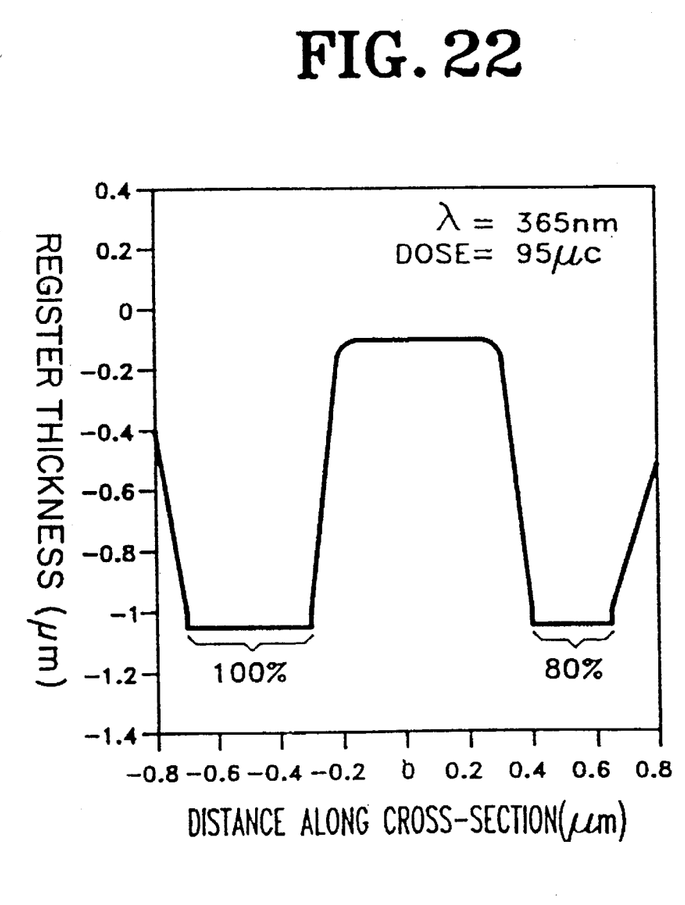

FIG. 21 and FIG. 22 are a plan view and a sectional view, respectively, showing a simulation of forming a photoresist pattern using a second mask of the present invention.

Specifically, a photoresist for forming a pattern is deposited in a layer approximately 1μm thick onto a semiconductor wafer having a step portion. Then, an i-ray light source (wavelength 365 nm) is irradiated at a dose of 95μC. The photoresist is then exposed and developed.

Specifically, 80% of the light exposure amount is irradiated onto the step of semiconductor wafer while 100% of the light exposure amount is irradiated onto semiconductor wafer. Thus, the problem of incomplete pattern formation can be solved, to thereby form a correct pattern.

Accordingly, when a new mask of the present invention is used, the same exposure focus can be irradiated onto a semiconductor wafer and a stepped portion formed thereon. Thus, a relatively clean and correct pattern can be formed by controlling the amount of exposure irradiated onto a step and a semiconductor wafer.

In addition, a simple SLR (single-layer resist) method having can be used instead of a complicated MLR method, thereby simplifying the process and in reducing costs. Further, the reliability of a semiconductor device can be greatly improved with a reduction of manufacturing failure and poor yield.

The foregoing description is intended to be merely illustrative, and should not be interpreted as limiting the scope of the invention. It is to be understood that changes and variations may be made without departing from the spirit or scope of the following claims.

What is claimed is:

1. A mask for projecting a pattern through a projection lens onto a semiconductor wafer having a base portion and a stepped portion thereon, the mask comprising:

a transparent mask substrate having a stepped portion and a base portion, wherein said mask substrate is thicker at said stepped portion than at said base portion, said stepped portion on said mask substrate corresponding to the stepped portion on the semiconductor wafer, wherein light passed through said mask substrate at said stepped portion differs in phase from light passed through said mask substrate at said base portion by approximately an integral multiple of $2\pi$ radians; and an opaque mask pattern formed on said mask substrate and arranged to block light from said mask substrate.

2. A mask according to claim 1, wherein said stepped portion on said mask substrate has a thickness substantially equal to a thickness of the stepped portion on the semiconductor wafer, multiplied by the mathematical square of a magnification of the projection lens.

3. A mask according to claim 1, wherein light passed through said mask substrate at said stepped portion differs in phase from light passed through said mask substrate at said base portion by 360°±5°.

4. A mask for projecting a pattern onto a semiconductor wafer having a base portion and a stepped portion provided thereon, the mask comprising:

a transparent mask substrate;

a transparent film pattern formed on a portion of said mask substrate so as to define a base portion and a stepped portion on said mask substrate, said stepped portion being thicker than said base portion, said stepped portion on said mask substrate corresponding to the stepped portion on the semiconductor wafer; and an opaque mask pattern formed on said mask substrate having said transparent film pattern formed thereon, said opaque mask pattern blocking light from said mask substrate and said transparent film pattern, wherein light passed through said mask substrate and said stepped portion defined by said transparent film pattern differs in phase from light passed through said mask substrate and said base portion defined said transparent film pattern by approximately an integral multiple of $2\pi$ radians.

5. A mask according to claim 4, wherein said transparent film pattern comprises spin-on glass (SOG).

6. A mask according to claim 1, wherein said stepped portion on said mask substrate has a sidewall which is substantially perpendicular to an upper surface of said base portion on said mask substrate.

7. A mask according to claim 1, wherein said stepped portion on said mask substrate has a sidewall which includes a plurality of substep portions.

8. A mask according to claim 1, wherein said stepped portion on said mask substrate has a sidewall which is sloped relative to an upper surface of said base portion on said mask substrate.

9. A method for manufacturing a mask for projecting a pattern through a projection lens onto a semiconductor wafer having a stepped portion and a base portion formed thereon, the method comprising the steps of:

forming a stepped portion and a base portion on a transparent mask substrate, the stepped portion on the mask substrate corresponding with the stepped portion on the semiconductor wafer; and forming an opaque mask pattern on the mask substrate, wherein light which passes through the mask substrate at the stepped portion differs in phase from light which passes through the mask substrate at the base portion by approximately an integral multiple of $2\pi$ radians.

10. A method for manufacturing a mask according to claim 9, wherein said step of forming the stepped portion and the base portion on the mask substrate is performed by etching the mask substrate.

11. A method for manufacturing a mask according to claim 9, wherein said step of forming the stepped portion and the base portion on the mask substrate is performed by depositing a transparent material onto the mask substrate and thereafter patterning the transparent material.

12. A method for manufacturing a mask according to claim 9, further including a step of making a sidewall of the stepped portion formed on the mask substrate substantially perpendicular to an upper surface of an adjacent base portion on the mask substrate by anisotropically etching the mask substrate.

13. A method for manufacturing a mask according to claim 9, wherein said step of forming the stepped portion on the mask substrate includes forming the stepped portion on the mask substrate so as to have a thickness substantially equal to a thickness of the stepped portion formed on the semiconductor wafer, multiplied by a magnification of the projection lens.

14. A method for manufacturing a mask according to claim 9, wherein said step of forming the stepped portion on the mask substrate includes a step of providing the stepped portion formed on the mask substrate with a sloped sidewall using a sloped etching method.

15. A method for manufacturing a mask according to claim 14, wherein said step of providing the stepped portion formed on the mask substrate with a sloped sidewall is performed by slope-etching using a photoresist material.

16. A method for manufacturing a mask according to claim 14, wherein said step of providing the stepped portion formed on the mask substrate with a sloped sidewall comprises the steps of forming a slope in a photoresist, heating the photoresist to a temperature higher than a transition temperature of the mask substrate, and performing a slope etching according to a slope of the photoresist.

17. A method for manufacturing a mask according to claim 14, wherein said step of providing the stepped portion on the mask substrate with a sloped sidewall comprises the steps of forming perpendicularly shaped stepped portions on the mask substrate, depositing a transparent film over the mask substrate having the perpendicularly shaped stepped portions, forming a transparent film spacer on respective side walls of the perpendicularly shaped stepped portions by etching back the transparent film, and performing sloped etching using a slope of a respective transparent film spacer.

18. A method for manufacturing a mask according to claim 9, wherein said step of forming an opaque mask pattern comprises forming and patterning a chrome material layer.

19. A method for manufacturing a mask according to claim 9, wherein said step of forming an opaque mask pattern comprises forming and patterning a chrome oxide layer.

20. A mask for projecting a pattern through a projection lens onto a semiconductor wafer having a stepped portion formed thereon, the mask comprising:

a transparent mask substrate;

an opaque mask pattern formed on said mask substrate; and an optical transmittivity control film pattern formed on at least a part of said opaque mask pattern and said mask substrate, said optical transmittivity control film pattern defining a stepped portion and a base portion, wherein said stepped portion on said mask substrate corresponds to the stepped portion on the semiconductor wafer, wherein light passed through said stepped portion defined by said optical transmittivity control film pattern differs in phase from light passed through said base portion defined by said optical transmittivity control film pattern by approximately an integral multiple of $2\pi$ radians.

21. A method for manufacturing a mask for projecting a pattern through a projection lens onto a semiconductor wafer having a stepped portion formed thereon, the method comprising the steps of:

forming an opaque mask pattern on a transparent mask substrate;

forming an optical transmittivity control film on the mask substrate on which the opaque mask pattern is formed: and forming an optical transmittivity control film pattern by patterning the optical transmittivity control film, thereby defining a stepped portion and a base portion, the stepped portion defined by the optical transmittivity control film pattern corresponding to the stepped portion formed on the semiconductor wafer, wherein light passed through the stepped portion defined by the optical transmittivity control film pattern differs in phase from light passed through the base portion defined by the optical transmittivity control film pattern by approximately an integral multiple of $2\pi$ radians.

22. A method according to claim 21, wherein the mask substrate and the optical transmittivity control film pattern are made from different materials.

23. A method according to claim 22, wherein the optical transmittivity control film pattern is made from one of a photoresist, chrome, aluminum, and a spin-on glass, and wherein the mask substrate is made of quartz.

* * * * *